(12) United States Patent
Lutker-Lee et al.

(10) Patent No.: US 12,100,591 B2
(45) Date of Patent: Sep. 24, 2024

(54) PHOTOACTIVE METAL-BASED HARD MASK INTEGRATION

(71) Applicant: Tokyo Electron Limited, Tokyo (JP)

(72) Inventors: Katie Lutker-Lee, Albany, NY (US); Angelique Raley, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 390 days.

(21) Appl. No.: 17/666,343

(22) Filed: Feb. 7, 2022

(65) Prior Publication Data

US 2023/0253205 A1 Aug. 10, 2023

(51) Int. Cl.
*H01L 21/033* (2006.01)

(52) U.S. Cl.
CPC ...... *H01L 21/0332* (2013.01); *H01L 21/0337* (2013.01)

(58) Field of Classification Search
None
See application file for complete search history.

(56) References Cited

U.S. PATENT DOCUMENTS

2021/0066091 A1* 3/2021 Hsiao ............... H01L 21/76877

OTHER PUBLICATIONS

Clark et al., "Coater/Developer Process Integration of Metal Oxide Based Photoresist", Advances in Patterning Materials and Processes XXXII, Proc. of SPIE vol. 9425, Mar. 20, 2015, pp. 94251A-1-94251A-7, Downloaded From: http://proceedings.spiedigitallibrary.org/ on Mar. 18, 2016, 7 pages total.
Honda et al., "Patterning Enhancement Techniques by Reactive Ion Etch", Advanced Etch Technology for Nanopatterning, Proc. of SPIE vol. 8328, Mar. 16, 2012, pp. 832809-1-832809-8, Downloaded From: http://proceedings.spiedigitallibrary.org/ on Jul. 3, 2016, 8 pages total.
Lazzarino et al., "Self-aligned block technology: a step towards further scaling", Advanced Etch Technology for Nanopatterning VI, Proc. of SPIE vol. 10149, Apr. 7, 2017, pp. 1014908-1-1014908-10, Downloaded From: http://proceedings.spiedigitallibrary.org/pdfaccess.ashx?url=/data/conferences/spiep/92157/ on Jun. 2, 2017, 10 pages total.

(Continued)

*Primary Examiner* — Hsien Ming Lee
(74) *Attorney, Agent, or Firm* — Slater Matsil, LLP

(57) ABSTRACT

A method of processing a substrate that includes: depositing a photoactive metal-based hard mask (photo-MHM) over an underlying layer, the underlying layer formed over a substrate, the photo-MHM including a metal; depositing a dielectric over the photo-MHM; etching a portion of the dielectric to form a first feature; depositing a spacer material over the first feature; etching the spacer material to expose top surfaces of the dielectric and a first portion of the photo-MHM; exposing the photo-MHM to a first ultraviolet light (UV) radiation through a first photomask, a first unmasked region of the photo-MHM being photoreacted due to the exposure to the first UV radiation; after the exposure, developing the photo-MHM to form a second feature in the photo-MHM; and etching the underlying layer using the photo-MHM as an etch mask.

20 Claims, 9 Drawing Sheets

(56) References Cited

OTHER PUBLICATIONS

Liu et al., "Layout Decomposition and Synthesis for a Modular Technology to Solve the Edge-Placement Challenges by Combining Selective Etching, Direct Stitching, and Alternating-Material Self-Aligned Multiple Patterning Processes", Design-Process-Technology Co-optimization for Manufacturability X, Proc. of SPIE vol. 9781, Mar. 16, 2016, pp. 97810P-1-97810P-10, Downloaded From: http://proceedings.spiedigitallibrary.org/ on May 8, 2016, 10 pages total.

Luo et al., "Review of recent advances in inorganic photoresists", Royal Society of Chemistry, RSC Advances, Feb. 28, 2020, pp. 8385-8395, 11 pages total.

Raley et al., "Self-Aligned Blocking Integration Demonstration for Critical sub 40nm pitch Mx Level Patterning", Advanced Etch Technology for Nanopatterning VI, Proc. of SPIE vol. 10149, pp. 1014900-1-1014900-11, Apr. 7, 2017, Downloaded From: http://proceedings.spiedigitallibrary.org/pdfaccess.ashx?url=/data/conferences/spiep/92031/ on Jul. 31, 2017, 11 pages.

* cited by examiner

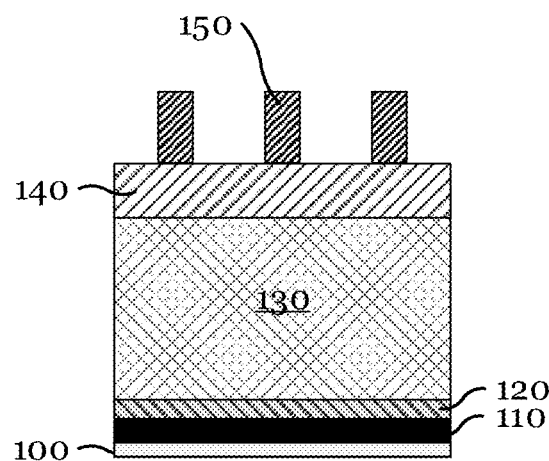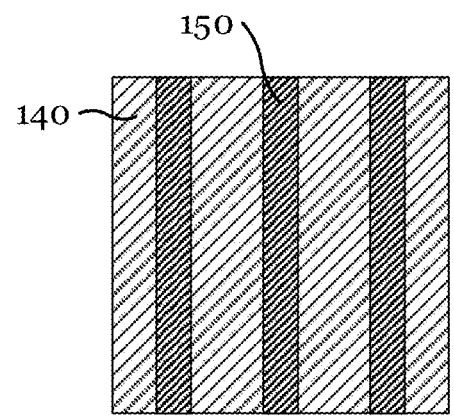
FIG. 1A　　　　　　　　FIG. 1B
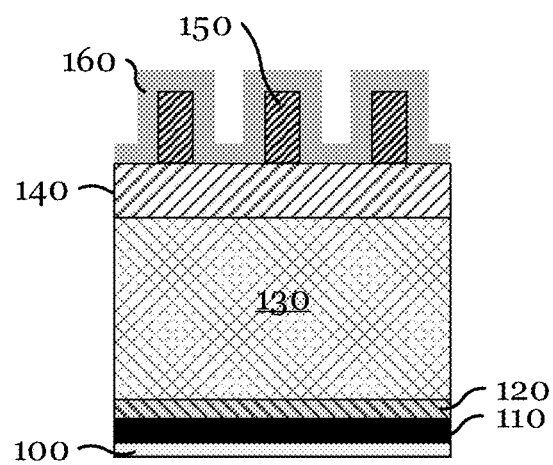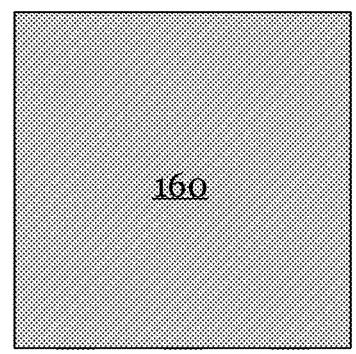
FIG. 1C　　　　　　　　FIG. 1D
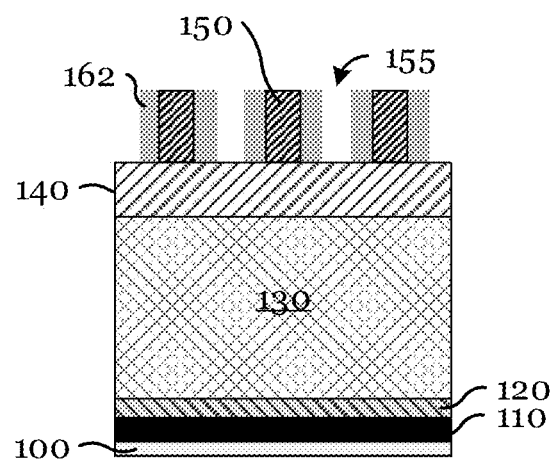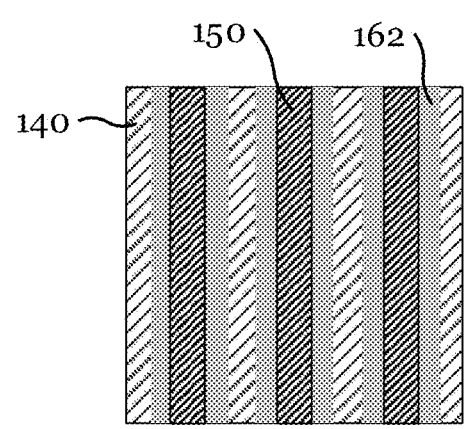
FIG. 1E　　　　　　　　FIG. 1F

PHOTOACTIVE METAL-BASED HARD MASK INTEGRATION

TECHNICAL FIELD

The present invention relates generally to a method of processing a substrate, and, in particular embodiments, to a method of photoactive metal-based hard mask integration.

BACKGROUND

Generally, a semiconductor device, such as an integrated circuit (IC) is fabricated by sequentially depositing and patterning layers of dielectric, conductive, and semiconductor materials over a substrate to form a network of electronic components and interconnect elements (e.g., transistors, resistors, capacitors, metal lines, contacts, and vias) integrated in a monolithic structure. Process flows used to form the constituent structures of semiconductor devices often involve depositing and removing a variety of materials while a pattern of several materials maybe exposed in a surface of the working substrate.

The minimum dimension of features in a patterned layer is shrunk periodically to roughly double the component density at each successive technology node, thereby reducing the cost per function. Innovations in patterning, such as immersion deep ultraviolet (i-DUV) lithography, multi patterning, and 13.5 nm wavelength extreme ultraviolet (EUV) optical systems have brought some critical dimensions down close to ten nanometers. This squeezes the margin for pattern misalignment (e.g., Total Edge Placement Error) and leads to, for example, stricter overlay requirements in multi patterning for advanced technology nodes (7 nm and below). Therefore, innovative process flows are needed for minimizing pattern misalignment.

SUMMARY

In accordance with an embodiment of the present invention, a method of processing a substrate that includes: depositing a photoactive metal-based hard mask (photo-MHM) over an underlying layer, the underlying layer formed over a substrate, the photo-MHM including a metal; depositing a dielectric over the photo-MHM; etching a portion of the dielectric to form a first feature; depositing a spacer material over the first feature; etching the spacer material to expose top surfaces of the dielectric and a first portion of the photo-MHM; exposing the photo-MHM to a first ultraviolet light (UV) radiation through a first photomask, a first unmasked region of the photo-MHM being photoreacted due to the exposure to the first UV radiation; after the exposure, developing the photo-MHM to form a second feature in the photo-MHM; and etching the underlying layer using the photo-MHM as an etch mask.

In accordance with an embodiment of the present invention, a method of processing a substrate that includes: depositing a photoactive metal-based hard mask (photo-MHM) over an underlying layer, the underlying layer formed over a substrate, the photoactive hard mask including a metal; depositing a protective layer over the photo-MHM; depositing a dielectric over the protective layer; etching a portion of the dielectric to form a first feature; depositing a spacer material over the first feature; etching the spacer material to expose top surfaces of the dielectric and a first portion of the protective layer; etching the first portion of the protective layer to expose a first portion of the photo-MHM; exposing the photo-MHM to a first ultraviolet light (UV) radiation through a first photomask, a first unmasked region of the photo-MHM being photoreacted due to the exposure to the first UV radiation, the protective layer blocking the first UV radiation; after the exposure, developing the photo-MHM to form a second feature in the photo-MHM; and etching the underlying layer using the photo-MHM as an etch mask.

In accordance with an embodiment of the present invention, a method of multiple patterning for a semiconductor device that includes: depositing a photoactive metal-based hard mask (photo-MHM) over an underlying layer, the underlying layer formed over a substrate, the photoactive hard mask including a metal; forming a mandrel over the photo-MHM, the mandrel having a pitch size of 40 nm or less; depositing a spacer material over the substrate; performing an etch back to remove lateral portions of the spacer material to expose top surfaces of the mandrel and a first portion of the photo-MHM; performing a first lithography process to pattern the photo-MHM, a first exposed region of the photo-MHM forming a first metal-oxide-network; performing a mandrel pull etch to remove the mandrel; performing a second lithography process to further pattern the photo-MHM, a second exposed region of the photo-MHM forming a second metal-oxide network; and developing the photo-MHM to remove a remainder of the photo-MHM, leaving the first metal-oxide network and the second metal-oxide network over the underlying layer.

BRIEF DESCRIPTION OF THE DRAWINGS

For a more complete understanding of the present invention, and the advantages thereof, reference is now made to the following descriptions taken in conjunction with the accompanying drawings, in which:

FIGS. 1A-1P illustrate an example substrate during an example process of photoactive metal-based hard mask integration in accordance with various embodiments;

FIG. 1A illustrates a cross sectional view of an incoming substrate comprising a mandrel and FIG. 1B illustrates a top view of the substrate in Figure iA;

FIG. 1C illustrates a cross sectional view of the substrate after a spacer deposition and FIG. 1D illustrates a top view of the substrate in FIG. 1C;

FIG. 1E illustrates a cross sectional view of the substrate after a spacer etch and FIG. 1F illustrates a top view of the substrate in FIG. 1E;

FIG. 1O illustrates a cross sectional view of the substrate after an underlying layer etch using the photoactive metal-based hard mask as an etch mask and FIG. 1P illustrates a top view of the substrate in FIG. 1O;

FIGS. 2A-2D illustrate another example substrate during an example process of photoactive metal-based hard mask integration with only one lithographic step in accordance with alternate embodiments, wherein FIG. 2A illustrates a cross sectional view of the substrate after a mandrel pull etch before an exposure to a UV radiation, FIG. 2B illustrates a top view of the substrate in FIG. 2A, FIG. 2C illustrates a cross sectional view of the substrate after the exposure to the UV radiation, and FIG. 2D illustrates a top view of the substrate in FIG. 2C;

FIGS. 3A-3H illustrate cross sectional views of yet another example substrate during an example process of photoactive metal-based hard mask integration using a protective layer to protect the photoactive metal-based hard mask in accordance with other embodiments, wherein FIG. 3A illustrates an incoming substrate having a protective layer over a photoactive metal based hard mask, FIG. 3B illustrates the substrate after a spacer deposition, FIG. 3C illustrates the substrate after a spacer etch, FIG. 3D illustrates the substrate after a first exposure to a first UV radiation, FIG. 3E illustrates the substrate after a mandrel pull etch, FIG. 3F illustrates the substrate after a second exposure to a second UV radiation, FIG. 3G illustrates the substrate after a developing step, and FIG. 3H illustrates the substrate after an underlying layer etch using the photoactive metal-based hard mask as an etch mask; and FIGS. 4A-4C illustrate process flow charts of photoactive metal-based hard mask integration in accordance with various embodiments, wherein FIG. 4A illustrates some embodiment process flows, FIG. 4B illustrates other embodiment process flows, and FIG. 4C illustrates alternate embodiment process flows.

DETAILED DESCRIPTION OF ILLUSTRATIVE EMBODIMENTS

Figure 1G:
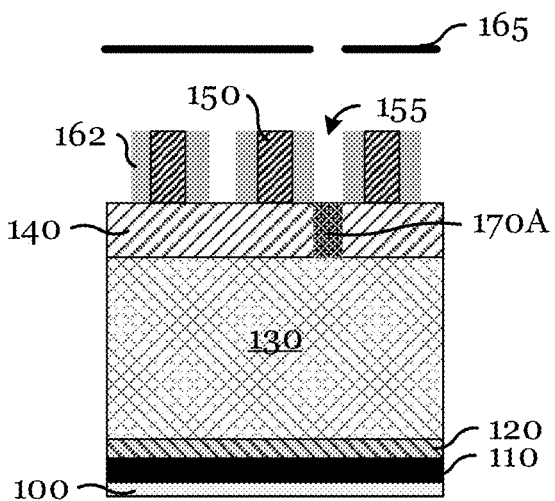
FIG. 1G illustrates a cross sectional view of the substrate after a first exposure to a first ultraviolet light (UV) radiation and FIG. 1H illustrates a top view of the substrate in FIG. 1G.

This application relates to a method of patterning during semiconductor device fabrication, more particularly to photoactive metal-based hard mask (photo-MHM) integration. As the semiconductor technology node continues to shrink, the requirement for precise placement of features (e.g., metal lines, contacts, and vias) becomes increasingly more stringent. To minimize pattern misalignment (e.g., Total Edge Placement Error), current fabrication processes often require additional layers to be deposited/patterned such as blocks and photoresists. However, these process flows tend to be more complex and costly. Further, such additional steps may restrict material selection in the fabrication processes. Therefore, a simplified patterning method with little to no misalignment may be desired. Embodiments of the present application disclose a patterning method using a photoactive metal-based hard mask (photo-MHM) that can function as both an etch mask and a photoresist.

Compared with currently available methods, the methods described in this disclosure may advantageously simplify the process flow by reducing the number of steps needed for fabricating features such as vias, cuts, and blocks. The photo-MHM integration in various embodiments does not require steps to deposit, pattern, and remove additional fill materials. Eliminating such steps maybe beneficial in improving subsequent process steps such as high aspect ratio etches and reducing the risks of undesired chemistry in the materials used. The methods herein also improve self-alignment of cuts and blocks by using photo-MHM, advantageously reducing pattern misalignment. Embodiments of this disclosure are applicable to various lithographic techniques including 193 nm immersion lithography and extreme ultraviolet (EUV) lithography. Another advantage of the photo-MHM is the ability to use a dry or wet process for deposition and for development. Further, various embodiments enable fine tuning of the profile of the photo-HMH at a developing step.

In the following, various embodiments of photoactive metal-based hard mask (photo-MHM) integration using a self-aligned multiple patterning process are described. Although the various embodiments of photo-MHM integration are primarily described using a self-aligned double patterning (SADP), the methods herein may be applied to other multiple patterning techniques such as self-aligned quadruple patterning (SAQP). In a self-aligned multiple patterning process, a patterned layer referred to as a mandrel is first formed, and spacers are then formed on the sidewalls of the formed mandrel. After performing a spacer etch to partially remove the spacers and a mandrel pull etch to selectively remove the mandrel, the spacers may comprise smaller features, which may be below the lithographic limit. The spacers, with or without removing the mandrel by the mandrel pull etch, may be used for forming cuts and blocks designed for transferring patterns to an underlying layer. FIGS. 1A-1P illustrate an example process of photo-MHM integration in SADP in accordance with various embodiments. FIGS. 2A-2D then illustrates another embodiment where a mandrel pull etch is performed before a lithographic process. In some embodiments, a protective layer may be used to improve the lithographic process. This is described referring to FIGS. 3A-3H. Process flow diagrams of the methods in accordance with various embodiments are described in FIGS. 4A-4C. All figures are drawn for illustration purpose only and not to scale.

FIGS. 1A-1P illustrate a substrate 100 during an example process of photoactive metal-based hard mask (photo-MHM) integration in accordance with various embodiments. FIG. 1A illustrates a cross-sectional view of an incoming substrate 100, and FIG. 1B illustrates a top view of the incoming substrate 100.

In various embodiments, the substrate 100 may be a part of semiconductor device, and may have undergone a number of steps of processing following, for example, a conventional process. The substrate 100 accordingly may comprise layers of semiconductors useful in various microelectronics. For example, the semiconductor structure may comprise the substrate 100 in which various device regions are formed. In FIG. 1A, the substrate 100 comprises a conductive layer 110, an etch stop layer (ESL) 120, an interlevel layer 130, a photoactive metal-based hard mask (photo-MHM) 140, and a mandrel 150. The structure illustrated in FIG. 1A is for example and other suitable structures are also possible in the photo-MHM integration.

In one or more embodiments, the substrate 100 may be a silicon wafer, or a silicon-on-insulator (SOI) wafer. In certain embodiments, the substrate 100 may comprise a silicon germanium wafer, silicon carbide wafer, gallium arsenide wafer, gallium nitride wafer and other compound semiconductors. In other embodiments, the substrate 100 comprises heterogeneous layers such as silicon germanium on silicon, gallium nitride on silicon, silicon carbon on silicon, as well layers of silicon on a silicon or SOI substrate. In various embodiments, the substrate 100 is patterned or embedded in other components of the semiconductor device.

As illustrated in FIG. 1A, the substrate 100 may further comprises the conductive layer 110 formed over the substrate 100. In some embodiments, there may be one or more layers such as dielectric layers and devices between the substrate 100 and the conductive layer 110. In various embodiments, the conductive layer 110 may be formed as a part of metal interconnects patterned over the substrate 100.

In various embodiments, the conductive layer 110 may comprise copper (Cu), aluminum (Al), doped polysilicon, tungsten, titanium nitride, tantalum nitride, ruthenium, and other metals. The conductive layer 110 may be formed by deposition using, for example, a physical vapor deposition (PVD).

Over the conductive layer 110, a dielectric layer may be deposited as an etch stop layer (ESL) 120. In various embodiments, the ESL 120 may comprise silicon carbide, silicon nitride, other silicon-based materials, aluminum oxide, aluminum nitride, or zirconium oxide. The ESL 120 may be deposited using deposition techniques such as vapor deposition including chemical vapor deposition (CVD), physical vapor deposition (PVD), and atomic layer deposition (ALD), as well as other plasma processes such as plasma enhanced CVD (PECVD), sputtering, and other processes. In certain embodiments, the thickness of the ESL 120 may be between 2 nm to 15 nm. In some embodiments, there may be no ESL. In one embodiment, the ESL 120 may be sandwiched by a top blocking layer and a bottom blocking layer. The blocking layers may comprise a silicon-based dielectric material such as silicon nitride and silicon carbon nitride (SiCN) or aluminum oxide or aluminum nitride or aluminum oxynitride. In this disclosure, the blocking layers, if any, are regarded as a part of the ESL 120 illustrated in FIG. 1A.

Over the etch stop layer (ESL) 120, another layer may be formed as an interlevel layer 130. The interlevel layer 130 may comprise a silicon-based dielectric material with a low dielectric constant (i.e., low-k value) such as organosilicate glass (SiCOH), dense SiCOH, porous SiCOH, and other porous dielectric materials. The interlevel layer 130 may be deposited using deposition techniques such as vapor deposition including chemical vapor deposition (CVD), physical vapor deposition (PVD), and atomic layer deposition (ALD), as well as other plasma processes such as plasma enhanced CVD (PECVD), sputtering, and other processes. The interlevel layer 130 may be the layer that is to be patterned into one or more features by an etch process using a photoactive metal-based hard mask (photo-MHM), as described further below (e.g., FIG. 1O). The feature being etched into the interlevel layer 130 maybe any suitable feature. For example, although this disclosure primarily describes "recesses" with respect to the figures of this disclosure, it will be appreciated that other suitable features might be formed in a semiconductor layer, including (whether or not considered "recesses") lines, holes, trenches, vias, and/or other suitable structures, using embodiments of this disclosure. In certain embodiments, the interlevel layer 130 may be a layer stack comprising multiple layers. For example, a layer stack of a dielectric layer and a hardmask layer disposed over the dielectric layer may collectively comprise the interlevel layer 130.

As further illustrated in FIG. 1A, the photoactive metal-based hard mask (photo-MHM) 140 may be formed over the interlevel layer 130. In various embodiments, the photo-MHM 140 may comprise a metal based compound. In certain embodiments, the photo-MHM 140 may comprise a tin (Sn) based compound, and in other embodiments a zirconium (Zr), indium (In), antimony (Sb), bismuth (Bi), or hafnium (Hf) based compound. In various embodiments, the metal of the photo-MHM 140 may mostly be in an oxide form. The photo-MHM 140 may function as both a photoresist during lithographic processes and an etch mask during etch processes for underlying layers (e.g., the interlevel layer 130). The photo-MHM 140 may be a negative tone resist or a positive tone resist. The photo-MHM 140 may advantageously be deposited either a dry process or a wet process. In some embodiments, the deposition of the photo-MHM 140 maybe performed using deposition techniques such as vapor deposition including chemical vapor deposition (CVD), physical vapor deposition (PVD), and atomic layer deposition (ALD), as well as other plasma processes such as plasma enhanced CVD (PECVD), sputtering, and other dry processes. In other embodiments, the deposition may be performed using a wet process such as a spin-on process. In certain embodiments, the thickness of the photo-MHM 140 may be between about 10 nm to about 40 nm.

In certain embodiments, an optional intermediate layer may be formed between the interlevel layer 130 and the photo-MHM 140 (not illustrated in FIG. 1A). In one or more embodiments, the optional intermediate layer may comprise silicon oxide, silicon nitride, silicon oxynitride, or a dense SiCOH. The silicon oxide may be prepared, for example, by plasma-enhanced CVD or flowable CVD using tetraethyl orthosilicate (TEOS) as a precursor. Such an intermediate layer may advantageously function as a chemical mechanical planarization (CMP) stopping layer or landing layer, and also improve mask removal, pattern transfer fidelity, or the protection of the interlevel layer 130 from corrosive gases that maybe used for etch processes.

Over the photo-MHM 140, the mandrel 150 may be formed. In FIG. 1A, three line structures are illustrated as an example for the mandrel 150 in accordance with one embodiment, but other suitable structures may be formed as the mandrel 150. In various embodiments, the mandrel 150 may comprise hard mask materials, soft mask materials, or organic based materials. In one or more embodiments, the mandrel 150 comprises amorphous silicon, or any other type of sacrificial material known within the art. The mandrel 150 may also compromise a plasma polymerized organic film, spin on film or dielectric film. The mandrel 150 may be formed by, for example, a conventional lithographic process using a lithography stack to pattern a layer to the features of the mandrel 150. The mandrel 150 may have a desired height and width. In various embodiments, the ratio of the height to the width of the mandrel 150 (i.e., the aspect ratio) is between 2:1 to 20:1. In various embodiments, the mandrel 150 may have a height of about 30 nm to 60 nm, and in one embodiment about 40 nm to about 50 nm. The critical dimensions (CD) of the mandrel 150 maybe selected in consideration of the quality of spacers to be formed on the sidewalls of the mandrel 150. For example, if the height of the mandrel 150 is not sufficient, the formation of uniform spacers may be hampered. In one or more embodiments, the mandrel 150 may have the CD of 50 nm or less. In one embodiment, the mandrel 150 may be formed with a pitch size of 100 nm or less. As will be clear from the fabrication process further described, the mandrel 150 is an intermediate structure used to form etch/hard masks. Additionally, the mandrel 150 can be used to define the distance between adjacent features, such as etch/hard masks or other mandrels.

FIG. 1C illustrates a cross sectional view of the substrate 100 after a spacer deposition and FIG. 1D illustrates a corresponding top view of the substrate 100.

In FIGS. 1C and 1D, a layer of a spacer material 160 is deposited over the substrate 100, conformally covering surfaces comprising the photo-MHM 140 and the mandrel 150. In various embodiments, the spacer material 160 maybe deposited using a conformal deposition process such as atomic layer deposition (ALD) or any other conformal deposition technique used within semiconductor device fabrication. The spacer material 160 may comprise silicon oxide, silicon nitride, titanium nitride, titanium oxide, or any other type of oxide or insulating material known within the art. In various embodiments, the spacer material 160 is different from the material of the mandrel 150. In certain embodiments, the thickness and CD of the spacer material 160 to be produced maybe determined based on the thickness and CD of the mandrel 150 as well as the target final pitch. In one or more embodiments, the thickness of the layer of the spacer material 160 is between about 5 nm to about 30 nm.

FIG. 1E illustrates a cross sectional view of the substrate 100 after a spacer etch and FIG. 1F illustrates a corresponding top view of the substrate 100.

In FIGS. 1E and 1F, the spacer material 160 is etched by an anisotropic etching process, such as reactive ion etch (RIE). In this spacer etch, the spacer material 160 may be removed selectively from the substantially horizontal surfaces, thereby forming sidewall spacers 162 adhering to the near-vertical edges of the mandrel 150. As illustrated in FIG. 1E, the gaps between the mandrel 150 are narrowed by twice the thickness of the sidewall spacers 162, forming first recesses 155. In various embodiments, the spacer etch may be timed to expose the top surfaces of the mandrel 150, the photo-MHM 140, or both. Alternatively, the spacer etch may be stopped at an optional underlying etch stop layer that may be deposited over the photo-MHM 140. As illustrated in FIG. 1F, after the spacer etch, pillars of the photo-MHM 140, the sidewall spacers 162, and the mandrel 150 are visible in the top view. At this stage, only the regions of photo-MHM 140 exposed at the bottom of the first recesses 155 are available for patterning in a subsequent lithographic process as described below.

Figure 1H:
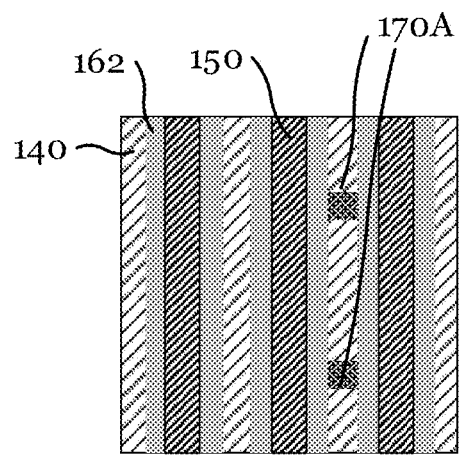

FIG. 1G illustrates a cross sectional view of the substrate 100 after a first exposure to a first ultraviolet light (UV) radiation and FIG. 1H illustrates a corresponding top view of the substrate 100.

In FIGS. 1G and 1H, a first lithographic process is performed by exposing the substrate 100 to the first UV radiation through a first photomask 165. With the first photomask 165, only an unmasked region of the substrate 100 is irradiated with the first UV radiation. In some embodiments, deep ultraviolet (DUV) 193 nm immersion photolithography may be used, and in other embodiments, extreme ultraviolet (EUV) lithography may be used. Any other suitable lithographic technique may be used to perform the first lithographic process. While EUV lithography offers superior lithographic resolutions than other techniques, EUV lithography systems may be costly and are not used in certain applications (e.g., 200 mm wafer fabrication or older wafer fabs with 300 nm). Various embodiments of photo-active metal-based hard mask integration may particularly be useful in fabrication processes where an EUV lithography system is not available. This is because the method can be implemented to an existing non-EUV lithography system and supplement the lithographic limit with minimal additional steps. Upon the exposure to the first UV radiation, the exposed region of the photo-MHM 140 at the bottom of the first recesses 155 photochemically reacts to form first reacted metal-based hard mask (first reacted-MHM) 170A. At this stage, the mandrel 150 is still present, preventing the formation of the first reacted-MHM 170A directly below the mandrel 150. In the illustrated example in FIGS. 1G and 1H, the pattern of the first photomask 165 provides two regions to be exposed to the first UV radiation, where the two regions are positioned in one of the first recesses 155, thereby making only one region of the first reacted-MHM 170A visible in FIG. 1G. Although illustrated as square regions, the regions illustrated in FIGS. 1G and 1H are examples only and any reasonable shapes and sizes for forming blocks/cuts known in the art are possible in various embodiments. The first photomask 165 is not illustrated in FIG. 1H for illustration purpose. In FIG. 1G and subsequent figures, the photo-MHM 140 is illustrated as a negative tone resist, although in other embodiments the photo-MHM 140 maybe a positive tone resist. In the case of the negative tone resist as illustrated in FIGS. 1G and 1H, the first reacted-MHM 170A may be insoluble in a developing solution that can dissolve the photo-MHM 140, enabling a pattern transfer by lithography. In one or more embodiments, the first reacted-MHM 170A maybe stable during a dry developing process such as a plasma etch that can remove the photo-MHM 140. In one or more embodiments, the photochemical reaction induced by the first UV radiation may include metal-oxygen bond formation, and accordingly the first reacted-MHM 170A may comprise a metal-oxide-network that is more insoluble and/or less volatile than the photo-MHM 140.

In certain embodiments, after the first exposure to the first UV radiation, a post-exposure bake may optionally be performed by thermally treating the substrate 100. The post-exposure bake may be beneficial in further differentiating the material properties of the first reacted-MHM 170A from that of the photo-MHM 140. In one or more embodiments, the post-exposure bake may be performed at 80-220° C.

Figure 1I:
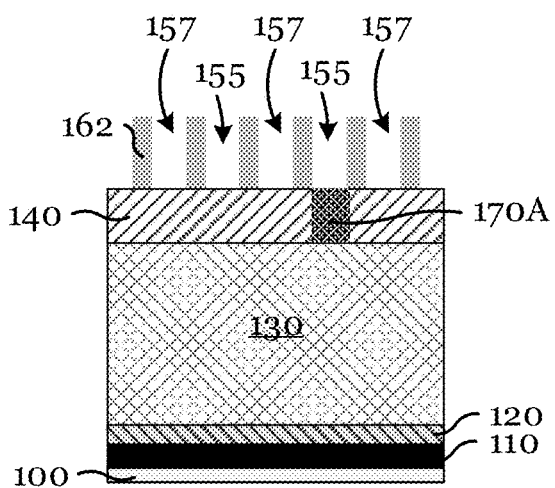
FIG. 1I illustrates a cross sectional view of the substrate after a mandrel pull etch and FIG. 1J illustrates a top view of the substrate in FIG. 1I.
Figure 1J:
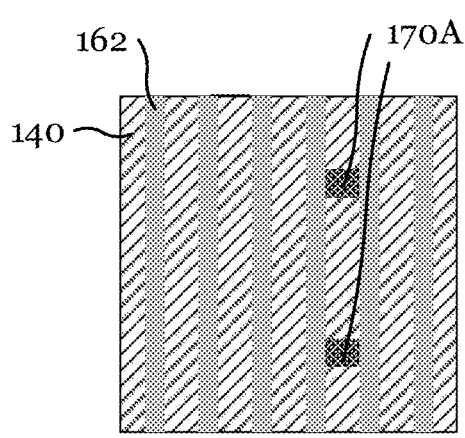

FIG. 1I illustrates a cross sectional view of the substrate 100 after a mandrel pull etch and FIG. 1J illustrates a corresponding top view of the substrate 100.

The mandrel pull etch is performed to remove the mandrel 150, forming second recesses 157 and exposing the photo-MHM 140 at the bottom of the second recesses 157 as illustrated in FIGS. 1I and 1J. As a result, all of the sidewall spacers 162 become free standing. As described above referring to FIGS. 1E and 1F, before the mandrel pull etch, only the regions of photo-MHM 140 exposed at the bottom of the first recesses 155 were available for patterning (e.g., the first lithographic process described referring to FIGS. 1G and 1H). Since the mandrel pull etch opens up the second recesses 157, all regions of photo-MHM 140 that are not masked by the sidewall spacers 162 become available for patterning in a subsequent lithographic process (e.g., a second lithographic process described below) as illustrated in FIG. 1J. In various embodiments, the mandrel pull etch may be performed by an anisotropic plasma etch process, such as reactive ion etch (RIE). Alternately, the mandrel pull etch may be performed by a conventional wet etching process.

Figure 1K:
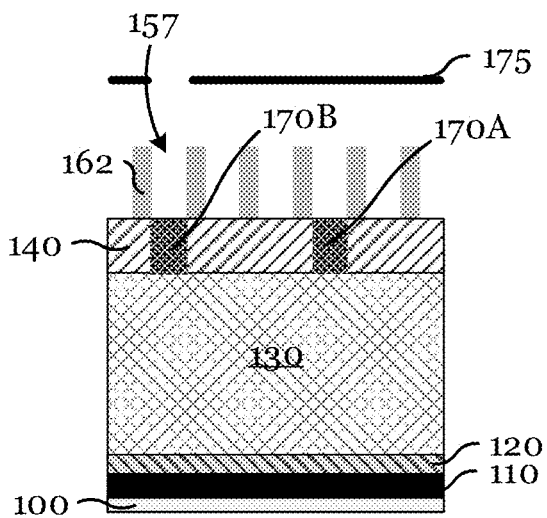
FIG. 1K illustrates a cross sectional view of the substrate after a second exposure to a second UV radiation and FIG. 1L illustrates a top view of the substrate in FIG. 1K.
Figure 1L:
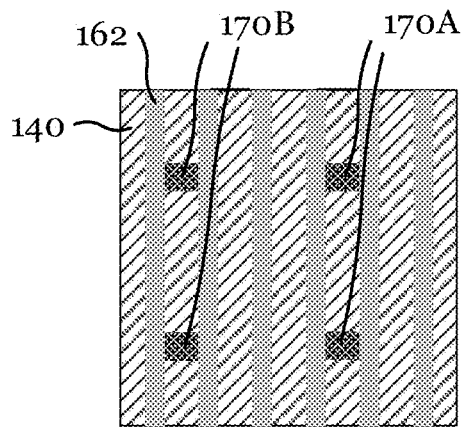

FIG. 1K illustrates a cross sectional view of the substrate 100 after a second exposure to a second UV radiation and FIG. 1L illustrates a corresponding top view of the substrate 100.

In FIGS. 1K and 1L, a second lithographic process is performed by exposing the substrate 100 to the second UV radiation through a second photomask 175. With the second photomask 175, only an unmasked region of the substrate 100 is irradiated with the second UV radiation. The second lithographic process may be performed by the same technique as the first lithographic process or by different techniques. Any suitable lithographic technique may be used to perform the second lithographic process. Similarly to the first lithographic process, the exposed region of the photo-MHM 140 photochemically reacts to form second reacted metal-based hard mask (second reacted-MHM) 170B. In various embodiments, the first reacted-MHM 170A and the second reacted-MHM 170B may have the same material properties. In the illustrated example in FIGS. 1K and 1L, the pattern of the second photomask 175 provides two square regions to be exposed to the second UV radiation, where the two square regions are positioned in one of the second recesses 157, thereby making only one region of the second reacted-MHM 170B visible in FIG. 1K. The second photomask 175 is not illustrated in FIG. 1L for illustration purpose. Because the regions available for the above two lithographic processes are different to each other due to the presence/absence of the mandrel 150, various embodiments advantageously alleviate the issues of pattern misalignment due to the lithographic limit. Further, the use of photoactive metal-based hard mask (photo-MHM) allows patterning a layer of the photo-MHM twice with two different patterns and eliminates the need of forming additional lithography stacks that may be costly and complicated.

In certain embodiments, after the second exposure to the first UV radiation, a post-exposure bake may optionally be performed by thermally treating the substrate 100. In one or more embodiments, the post-exposure bake maybe performed at 80-220° C. In one embodiment, the post-exposure bake maybe performed after the second exposure but not between the first exposure and the second exposure.

Figure 1M:
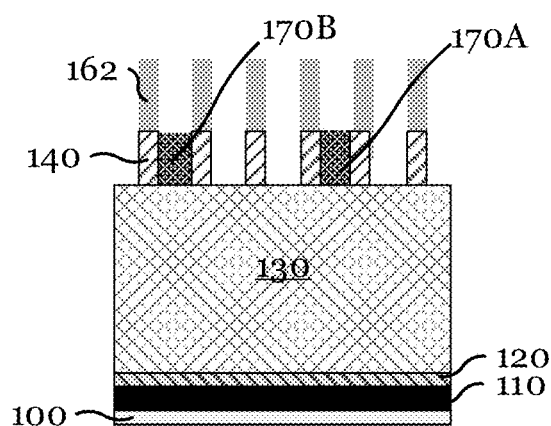
FIG. 1M illustrates a cross sectional view of the substrate after a developing step and FIG. 1N illustrates a top view of the substrate in FIG. 1M.
Figure 1N:
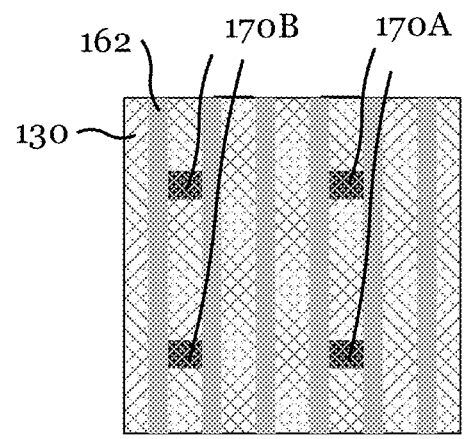

FIG. 1M illustrates a cross sectional view of the substrate 100 after a developing step and FIG. 1N illustrates a corresponding top view of the substrate 100.

By performing the developing step, the patterns from the photomasks used in the lithographic processes are transferred to the layer of the photo-MHM 140. The developing step may be a wet or dry process. In a wet developing process, the substrate 100 may be treated with a developing solution to dissolve the reacted region in case of a positive tone resist (e.g., the first reacted-MHM 170A and the second reacted-MHM 170A). In case of a negative tone resist, as illustrated, for example, in FIGS. 1M and 1N, the unreacted regions of the photoresist maybe dissolved (e.g., the photo-MHM 140). The developing solution may comprise a metal iron free (MIF) developer, for example, an aqueous solution of tetramethylammonium hydroxide (TMAH). In other embodiments, the developing solution may comprise a metal ion containing developer, for example, an aqueous solution of sodium hydroxide (NaOH) or potassium hydroxide (KOH).

Alternately, a dry developing process maybe used in other embodiments. The dry process may comprise, for example, a selective plasma etch process, purely chemical process or a thermal process, advantageously eliminating the use of a developing solution. In certain embodiments, the dry process may be performing using reactive ion etching (RIE) process or atomic layer etching (ALE).

Figure 1O:
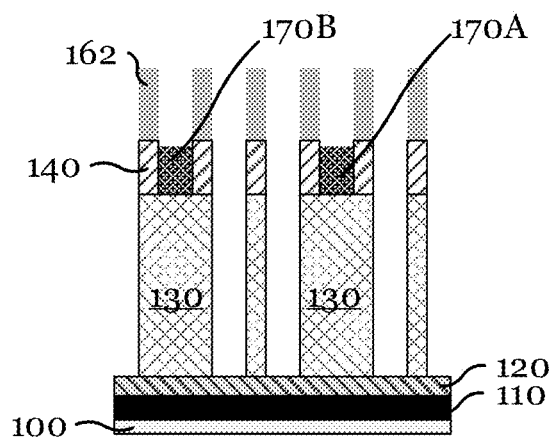
Figure 1P:
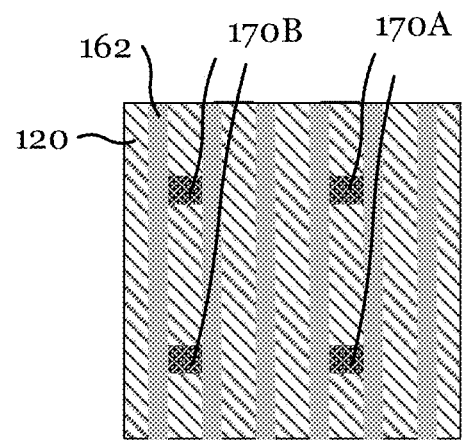

FIG. 1O illustrates a cross sectional view of the substrate 100 after an underlying layer etch and FIG. 1P illustrates a corresponding top view of the substrate 100.

In FIGS. 1O and 1P, the pattern of the photoresist and spacer (e.g., the photo-MHM 140, the first reacted-MHM 170A, and the second-MHM 170B and the sidewall spacers 162) is transferred to the interlevel layer 130 by a pattern transfer etch step. In various embodiments, the remaining layers above the interlevel layer 130 may function as an etch mask (e.g., the sidewall spacers 162, the photo-MHM 140, the first reacted-MHM 170A, and the second-MHM 170B). The pattern transfer etch step anisotropically removes the portions of the interlevel layer 130 that were not masked. As illustrated in FIG. 1O, the etch step may be stopped when the etch stop layer (ESL) 120 is exposed in certain embodiments. In alternate embodiments, the etch step may also removes the ESL 120 to expose the conductive layer 110. A etch stop layer (ESL) may be used to stop the etch step but in some embodiments a timed etch may also be used. In certain embodiments, the pattern transfer etch step comprises one or more wet etch processes, plasma etch processes, reactive ion etch (RIE) processes, or combinations of these or other etch processes. In various embodiments, features with aspect ratio (the ratio of height to width) higher than 50:1 may be formed in the interlevel layer 130 using the pattern transfer etch step. In one or more embodiments, a higher aspect ratio such as 100:1 maybe formed, for example, as a part of fabricating an advanced 3D semiconductor device.

The process of photoactive metal-based hard mask (photo-MHM) integration may be applied at different fabrication stages (e.g., front-end-of-line or back-end-of-line). Accordingly, subsequent steps after the developing step as illustrated in FIGS. 1O and 1P may depend on the fabrication stage that the method is used for. In some embodiments, as described above, the pattern transfer etch may be performed immediately after the developing step. This may be useful in a fabrication process at Mo level. In certain embodiments, for example, when the fabrication process is at Mi level or above, via patterning or other processes may be performed before the pattern transfer etch described.

Figure 2A:
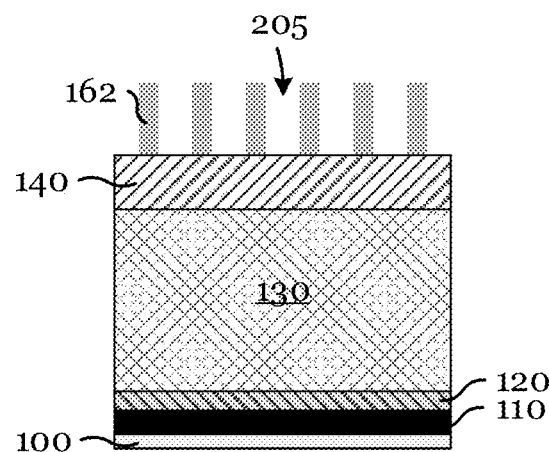
Figure 2B:
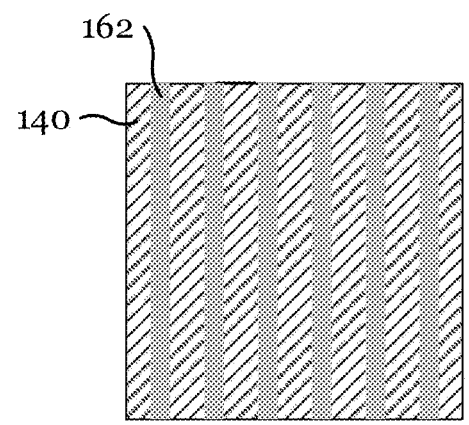

FIGS. 2A-2D illustrate a substrate 100 during an example process of photoactive metal-based hard mask (photo-MHM) integration with only one lithographic step in accordance with alternate embodiments. FIG. 2A illustrates a cross sectional view of the substrate 100 after a mandrel pull etch before an exposure to a UV radiation, and FIG. 2B illustrates a corresponding top view of the substrate 100.

In FIG. 2A, the substrate 100, having the same layers as illustrated in FIG. 1A, is processed by the same steps as the prior embodiments as illustrated in FIGS. 1A-1E, which include the mandrel formation, the spacer material deposition, and the spacer top hat etch. After the spacer etch, however, a mandrel pull etch is performed before a lithographic process. As a result, all of the sidewall spacers 162 are free standing and recesses 205 are formed between the sidewall spacers 162. Unlike the prior embodiments, since the mandrel has been removed before the lithographic process, the regions of the photo-MHM 140 that are not masked by the sidewall spacers 162 are available for the lithographic process.

Figure 2C:
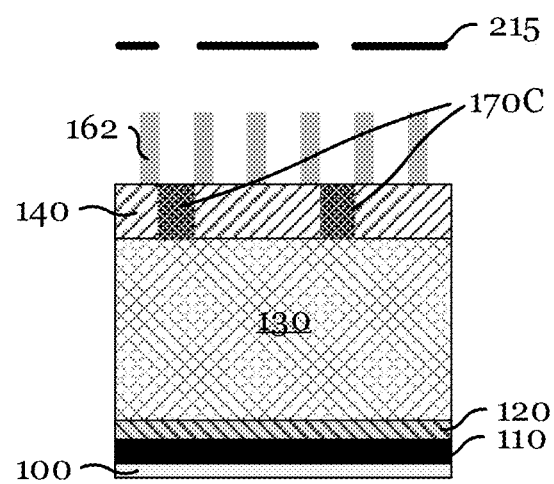
Figure 2D:
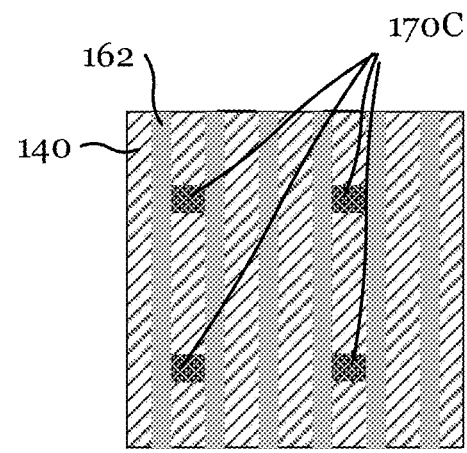

FIG. 2C illustrates a cross sectional view of the substrate 100 after the exposure to the UV radiation, and FIG. 2D illustrates a corresponding top view of the substrate 100.

In FIGS. 2C and 2D, a lithographic process is performed by exposing the substrate 100 to the UV radiation through a photomask 215. With the photomask 215, only an unmasked region of the substrate 100 is irradiated with the UV radiation. Any suitable lithographic technique may be used to perform the lithographic process. Upon the exposure to the UV radiation, the exposed region of the photo-MHM 140 photochemically reacts to form reacted metal-based hard mask (first reacted-MHM) 170C. After the lithographic process, the substrate 100 maybe processed with subsequent steps as already described referring to FIGS. 1M-1P, including the developing step and the etch for the underlying layer. Accordingly, such an embodiment may advantageously achieve target patterns with only one lithographic process if the target patterns are within the limit of one lithographic exposure. On the other hand, two or more lithographic processes as described in the prior embodiments maybe useful to form cuts and blocks that comprise sub-resolution features.

FIGS. 3A-3H illustrate cross sectional views of a substrate 100 during an example process of photoactive metal-based hard mask (photo-MHM) integration using a protective layer to protect the photo-MHM in accordance with other embodiments. In FIGS. 3A-3H, all features of the substrate may be the same as illustrated in FIGS. 1A-1P except the presence of a protective layer, and thus may not be repeated below.

Figure 3A:
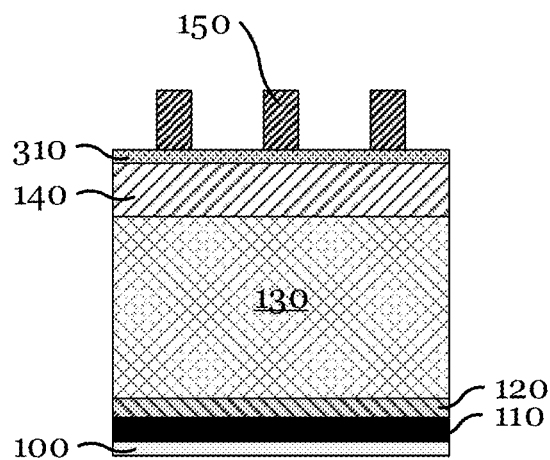

FIG. 3A illustrates an incoming substrate 100 having a protective layer 310 over a photoactive metal based hard mask (photo-MHM) 140.

In order to prevent potential damage to the photo-MHM during the fabrication processes, the protective layer 310 may be formed over the photo-MHM 140. Although the following is described in accordance with various embodiments for self-aligned double patterning (SADP) with two lithographic processes, other embodiments are also possible. For example, embodiments with only one lithographic process to pattern photo-MHM 140 as illustrated in FIGS. 2A-2D may also be benefited by including a protective layer in the substrate 100.

The protective layer 310 may be deposited using deposition techniques such as vapor deposition including chemical vapor deposition (CVD), physical vapor deposition (PVD), and atomic layer deposition (ALD), as well as other plasma processes such as plasma enhanced CVD (PECVD), sputtering, and other processes. The deposition of the protective layer 310 may also be performed by a wet process. In one or more embodiments, a spin-on process may be used to deposit a film comprising an organic material or an oxide. The protective layer 310 may protect the photo-HMH 140 during, for example, any step that involves etching (e.g., the mandrel formation, the spacer top hat etch, and/or the mandrel pull etch) that may potentially damage the photo-MHM 140. Therefore, the material of the protective layer 310 may be selected in consideration of etch resistance during the above etch processes. In addition, the protective layer 310 may also block a UV radiation to penetrate into the masked regions of the photo-MHM 140 during a lithographic process. In particular, if the lithographic process uses EUV, it maybe useful to have the protective layer 310 that has a high absorption coefficient for EUV.

Figure 3B:
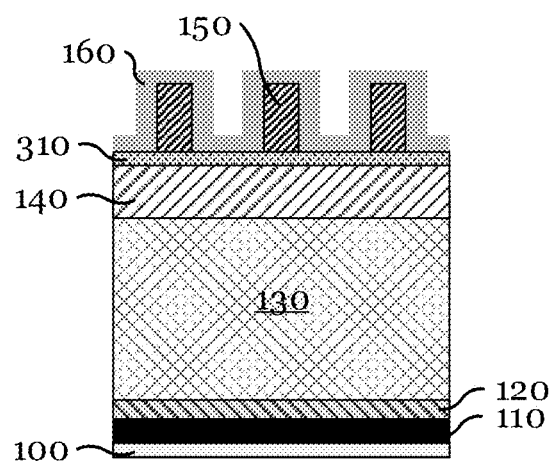
Figure 3C:
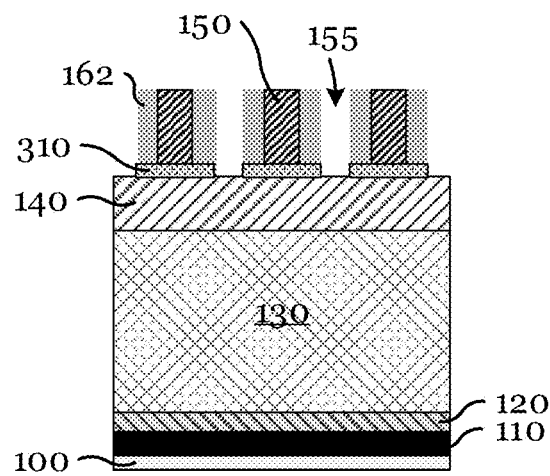

FIG. 3B illustrates the substrate 100 after a spacer deposition, and FIG. 3C illustrates the substrate after a spacer etch.

The spacer deposition maybe performed as previously described (e.g., FIGS. 1C and 1D). Subsequently, the spacer etch maybe performed also as previously described (e.g., FIGS. 1E and 1F), forming sidewall spacers 162 and first recesses 155. The protective layer 310 may function as a etch stop layer during the spacer etch, and another etch maybe performed next to remove the protective layer 310 to expose the photo-MHM 140 at the bottom of the first recesses 155. In certain embodiments, the spacer etch and the removal of the protective layer 310 may be performed in the same plasma process chamber. In one or more embodiments, a single etch process may be performed to remove both the spacer top hat and the protective layer 310.

Figure 3D:
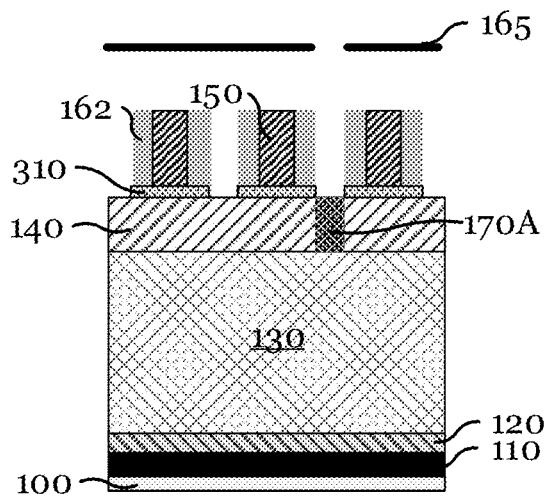

FIG. 3D illustrates the substrate 100 after a first exposure to a first UV radiation.

A first lithographic process maybe performed as described previously (e.g., FIGS. 1G and 1H). The exposed region of the photo-MHM 140 photochemically reacts to form first reacted metal-based hard mask (first reacted-MHM) 170A. In certain embodiments, after the first exposure to the first UV radiation, a post-exposure bake may optionally be performed by thermally treating the substrate 100.

Figure 3E:
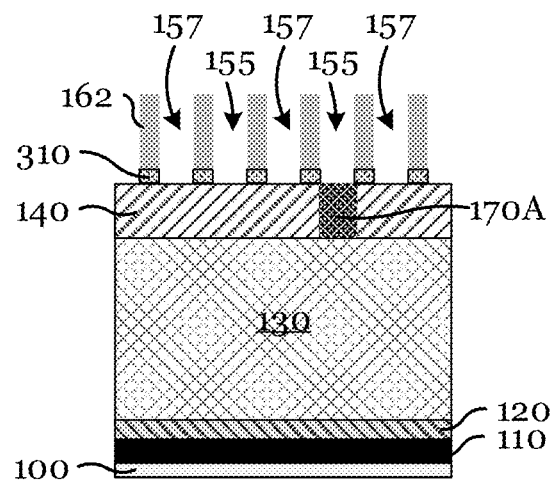

FIG. 3E illustrates the substrate 100 after a mandrel pull etch.

The mandrel pull etch maybe performed as previously described (e.g., FIGS. 1I and 1J), forming second recesses 157. The protective layer 310 may function as an etch stop layer during the mandrel pull etch, similar to during the spacer top hat etch, preventing damage to the photo-MHM 140. After the mandrel pull etch, another etch may be performed next to remove the protective layer 310 to expose the photo-MHM 140 at the bottom of the second recesses 157. In certain embodiments, the mandrel pull etch and the removal of the protective layer 310 maybe performed in the same plasma process chamber. In one or more embodiments, a single etch process may be performed to remove both the mandrel 150 and the protective layer 310.

Figure 3F:
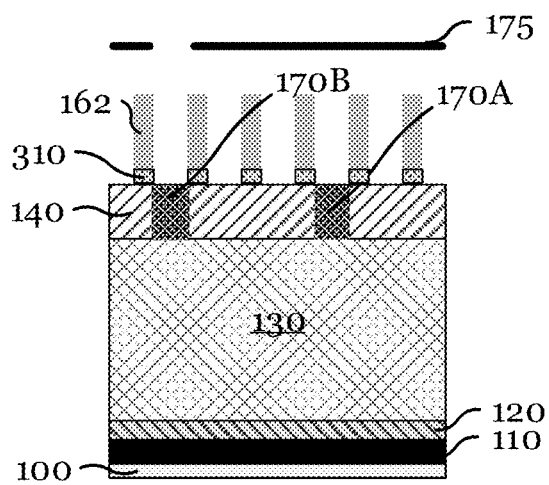
Figure 3G:
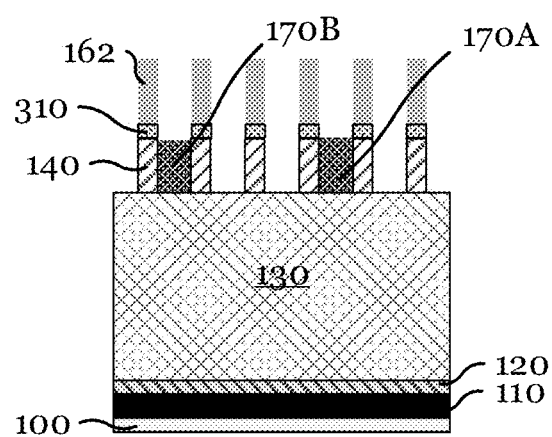
Figure 3H:
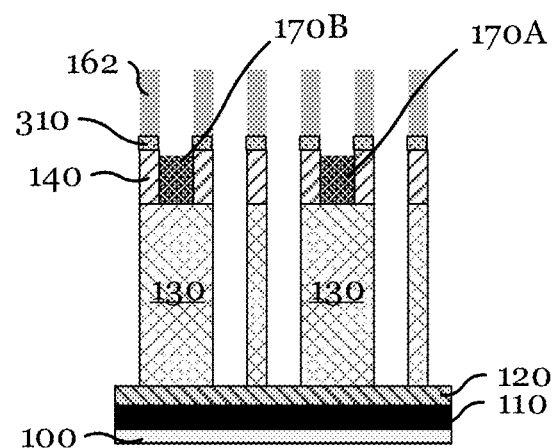

FIG. 3F illustrates the substrate 100 after a second exposure to a second UV radiation, FIG. 3G illustrates the substrate 100 after a developing step, and FIG. 3H illustrates the substrate 100 after an underlying layer etch.

After the steps of removing the mandrel 150 and the unmasked region of the protective layer 310 illustrated in FIG. 3E, subsequent processes (e.g., the second lithographic process, the developing step, and the etch for the underlying layer) may be performed as previously described (e.g., FIGS. 1K-1P). In certain embodiments, after the second exposure to the second UV radiation and before the developing step, a post-exposure bake may optionally be performed by thermally treating the substrate 100.

Figure 4A:
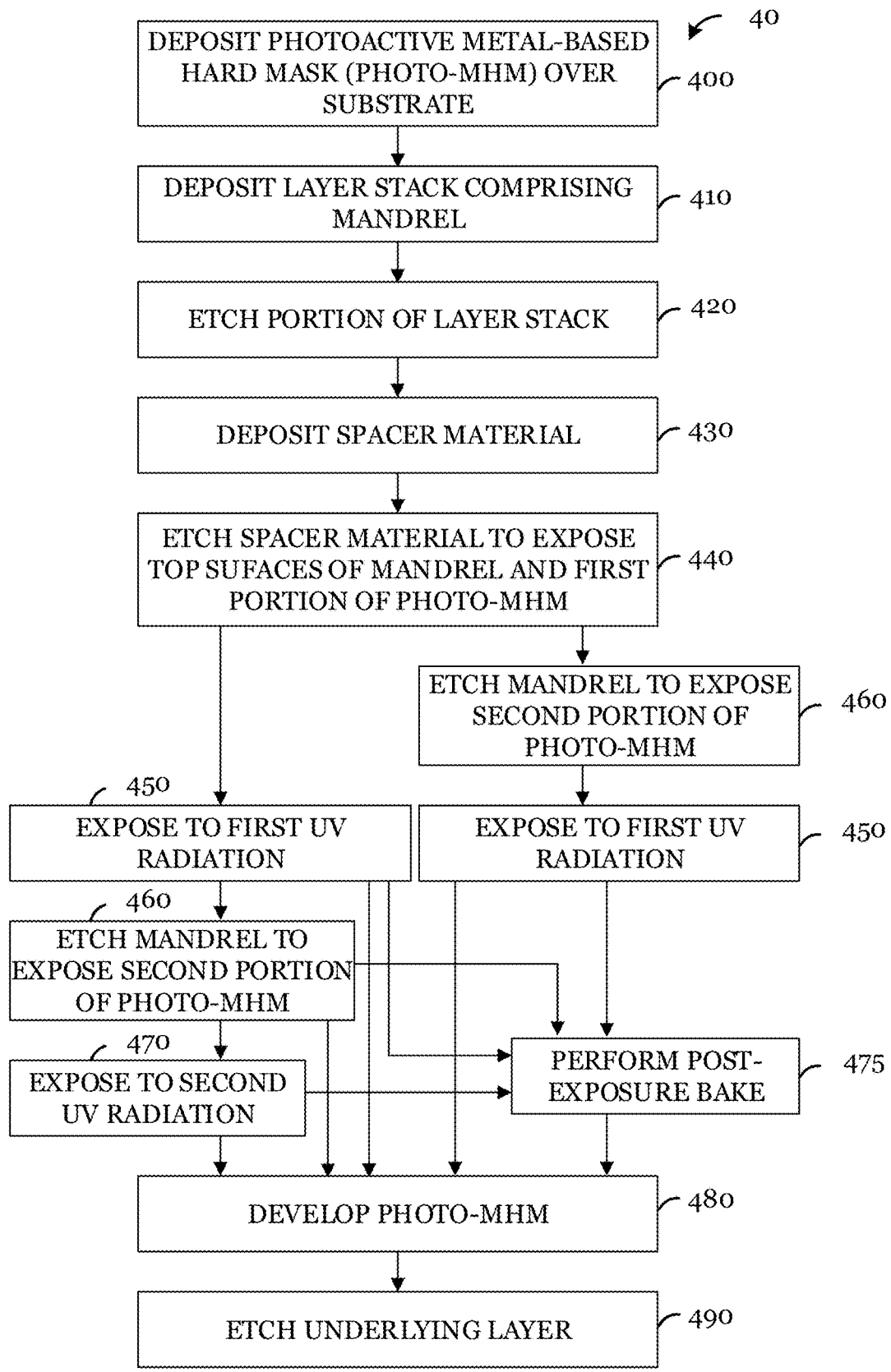
Figure 4B:
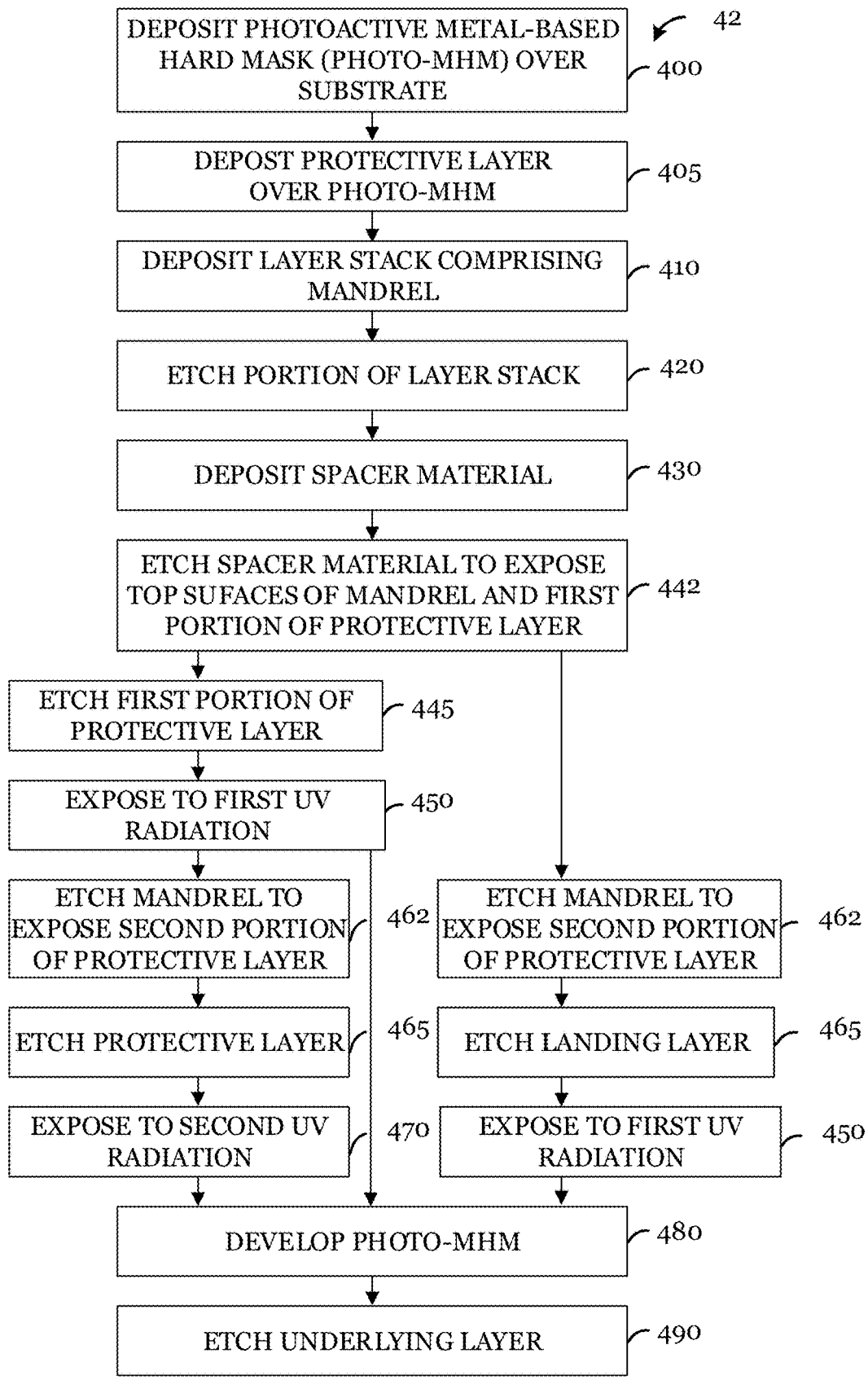
Figure 4C:
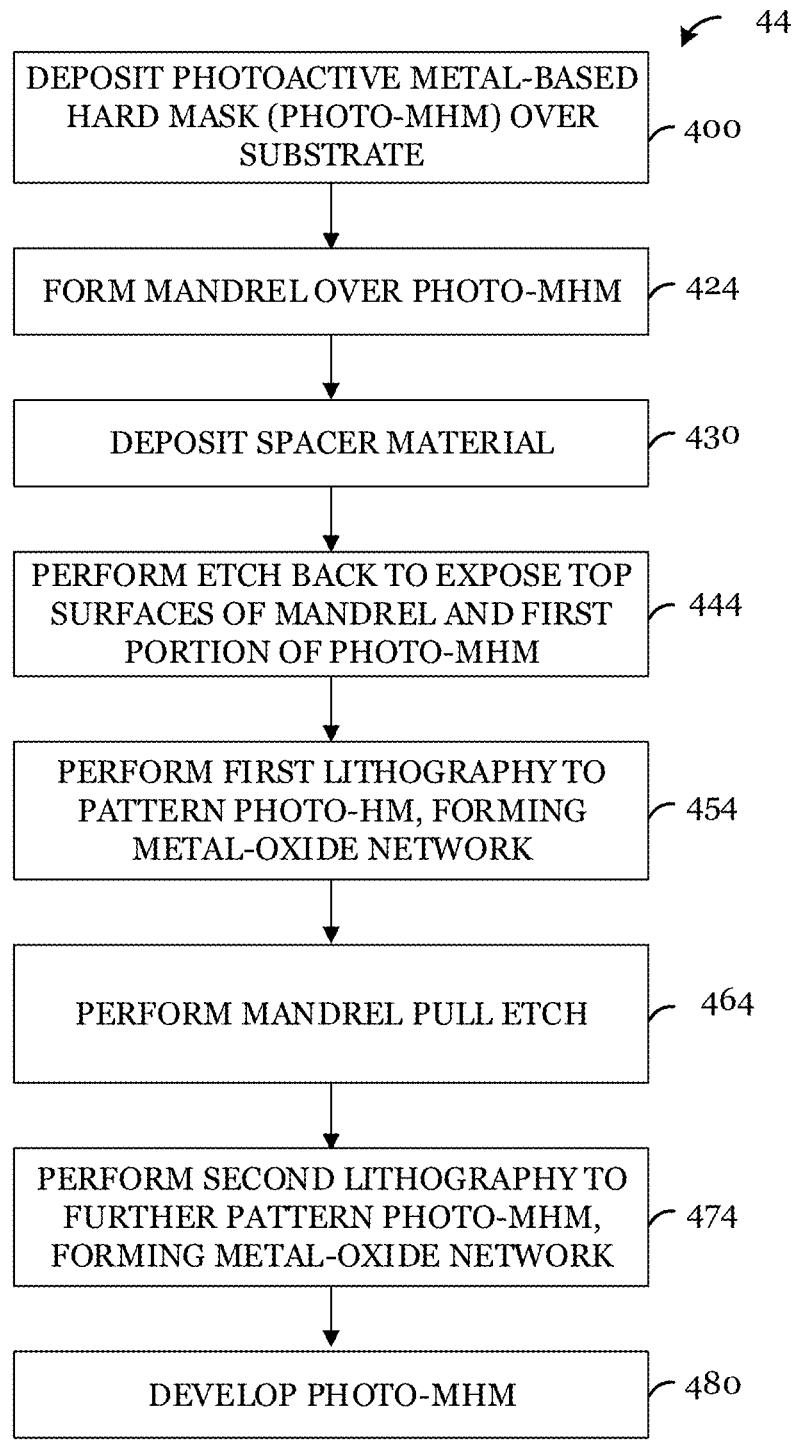

FIGS. 4A-4C illustrate process flow charts of photoactive metal-based hard mask integration (photo-MHM) in accordance with various embodiments. The process flow can be followed with the figures discussed above and hence will not be described again.

In FIG. 4A, a process flow 40 starts with depositing a photo-MHM over a substrate (block 400, FIG. 1A), followed by depositing a dielectric material over the photo-MHM (block 410, FIG. 1A). A mandrel formation is next performed by etching a portion of the dielectric material (block 420, FIG. 1A). Over the mandrel, a spacer material is deposited (block 430, FIG. 1C), and a spacer top hat etch is performed (block 440, FIG. 1E) to expose top surfaces of the dielectric material, i.e., the mandrel, and a first portion of the photo-MHM. In some embodiments, a first lithographic process is performed by exposing the substrate to a first UV radiation (block 450, FIG. 1G), followed by etching the dielectric material (i.e., a mandrel pull etch) to expose a second portion of the photo-MHM (block 460, FIG. 1I). A second lithographic process may then be performed by exposing the substrate to a second UV radiation (block 470, FIG. 1K). In certain embodiments, after the first lithographic process (block 450), etching the dielectric materials (block 460) and/or the second lithographic process (block 470) may be optional and skipped. In one or more embodiments, at any stage after the first lithographic process (block 450), a post-exposure bake may optionally be performed (block 475). Next, the photo-MHM may be developed (block 480, FIG. 1M) and an underlying layer of the substrate maybe etched using the patterned photo-MHM as an etch mask (block 490, FIG. 1O).

Still referring to FIG. 4A, in alternate embodiments, after the spacer etch (block 440) and before the developing step (block 480), the mandrel pull etch (block 460) may be performed first, followed by the exposure to the first UV radiation (block 450). An optional post-exposure bake may be performed (block 475).

FIG. 4B illustrates other embodiments with using a protective layer corresponding to FIGS. 3A-3H. In FIG. 4B, a process flow 42 starts with depositing a photo-MHM over a substrate (block 400, FIG. 3A). Next, a protective layer is deposited (block 405, FIG. 3A), followed by depositing a dielectric material over the protective layer (block 410, FIG. 3A). A mandrel formation is next performed by etching a portion of the dielectric material (block 420, FIG. 3A). Over the mandrel, a spacer material is deposited (block 430, FIG. 3B), and a spacer top hat etch is performed (block 442) to expose top surfaces of the dielectric material, i.e., the mandrel, and a first portion of the protective layer. In some embodiments, the first portion of the protective layer is then removed (block 445, FIG. 3C), for example, by another etch step. Next, a first lithographic process is performed by exposing the substrate to a first UV radiation (block 450, FIG. 3D), followed by etching the dielectric material (i.e., a mandrel pull etch) to expose a second portion of the protective layer (block 462). The second portion of the protective layer is then removed (block 465, FIG. 3E), for example, by another etch step. A second lithographic process may then be performed by exposing the substrate to a second UV radiation (block 470, FIG. 3F). In certain embodiments, after the first lithographic process (block 450), etching the dielectric materials (block 462), removing the second portion of the protective layer (block 465), and the second lithographic process (block 470) may be optional and skipped. Next, the photo-MHM maybe developed (block 480, FIG. 3G) and an underlying layer of the substrate maybe etched using the patterned photo-MHM as an etch mask (block 490, FIG. 3H).

Still referring to FIG. 4B, in yet alternate embodiments, after the spacer etch (block 442) and before the developing step (block 480), the mandrel pull etch (block 462) may be performed first, followed by removing the protective layer (block 465) and the exposure to the first UV radiation (block 450).

In FIG. 4C, a process flow 44 starts with depositing a photoactive metal-based hard mask (photo-MHM) over an underlying layer of a substrate (block 400, FIG. 1A), followed by forming a mandrel having a pitch size of 40 nm or less over the photo-MHM (block 424, FIG. 1A). Next, a spacer material is deposited (block 430, FIG. 1C) and an etch back is performed (block 444, FIG. 1E) to remove lateral portions of the spacer material to expose top surfaces of the mandrel and a first portion of the photo-MHM. A first lithography process (block 454, FIG. 1G) may then be performed to pattern the photo-MHM, where a first exposed region of the photo-MHM forming a first metal-oxide-network. A mandrel pull etch (block 464, FIG. 1I) may be performed next to remove the mandrel, followed by a second lithography process (block 474, FIG. 1K) to further pattern the photo-MHM. Lastly, the photo-MHM may be developed (block 480, FIG. 1M).

Example embodiments of the invention are summarized here. Other embodiments can also be understood from the entirety of the specification as well as the claims filed herein.

Example 1. A method of processing a substrate that includes: depositing a photoactive metal-based hard mask (photo-MHM) over an underlying layer, the underlying layer formed over a substrate, the photo-MHM including a metal; depositing a dielectric over the photo-MHM; etching a portion of the dielectric to form a first feature; depositing a spacer material over the first feature; etching the spacer material to expose top surfaces of the dielectric and a first portion of the photo-MHM; exposing the photo-MHM to a first ultraviolet light (UV) radiation through a first photomask, a first unmasked region of the photo-MHM being photoreacted due to the exposure to the first UV radiation; after the exposure, developing the photo-MHM to form a second feature in the photo-MHM; and etching the underlying layer using the photo-MHM as an etch mask.

Example 2. The method of example 1, further including, after etching the spacer material, etching the dielectric to expose a second portion of the photo-MHM.

Example 3. The method of one of examples 1 or 2, where etching the dielectric is performed after exposing the photo-MHM to the first UV radiation.

Example 4. The method of one of examples 1 to 3, further including, after etching the dielectric and before developing the photo-MHM, exposing the photo-MHM to a second UV radiation through a second photomask, a second unmasked region of the photo-MHM being photoreacted due to the exposure to the second UV radiation.

Example 5. The method of one of examples 1 to 4, further including, before developing the photo-MHM, performing a post-exposure bake by thermally treating the substrate.

Example 6. The method of one of examples 1 to 5, where depositing the photo-MHM is performed by a spin-on process.

Example 7. The method of one of examples 1 to 5, where depositing the photo-MHM is performed by a vapor deposition process.

Example 8. The method of one of examples 1 to 7, where the photo-MHM is a negative tone photoresist and where developing the photo-MHM removes the photo-MHM except the first unmasked region and the second unmasked region.

Example 9. The method of one of examples 1 to 7, where the photo-MHM is a positive tone photoresist and where developing the photo-MHM removes only the first unmasked region and the second unmasked region of the photo-MHM.

Example 10. The method of one of examples 1 to 9, where developing the photo-MHM is performed by a dry etch process.

Example 11. The method of one of examples 1 to 10, where the first feature includes recesses having a width of 20 nm or less.

Example 12. A method of processing a substrate that includes: depositing a photoactive metal-based hard mask (photo-MHM) over an underlying layer, the underlying layer formed over a substrate, the photoactive hard mask including a metal; depositing a protective layer over the photo-MHM; depositing a dielectric over the protective layer; etching a portion of the dielectric to form a first feature; depositing a spacer material over the first feature; etching the spacer material to expose top surfaces of the dielectric and a first portion of the protective layer; etching the first portion of the protective layer to expose a first portion of the photo-MHM; exposing the photo-MHM to a first ultraviolet light (UV) radiation through a first photomask, a first unmasked region of the photo-MHM being photoreacted due to the exposure to the first UV radiation, the protective layer blocking the first UV radiation; after the exposure, developing the photo-MHM to form a second feature in the photo-MHM; and etching the underlying layer using the photo-MHM as an etch mask.

Example 13. The method of example 12, further including: after etching the spacer material, etching the dielectric to expose a second portion of the protective layer; and etching the second portion of the protective layer to expose a second portion of the photo-MHM.

Example 14. The method of one of examples 12 or 13, where etching the dielectric is performed after exposing the photo-MHM to the first UV radiation.

Example 15. The method of one of examples 12 to 14, further including, after etching the dielectric, exposing the photo-MHM to a second UV radiation through a second photomask, a second unmasked region of the photo-MHM being photoreacted due to the exposure to the second UV radiation, the protective layer blocking the second UV radiation.

Example 16. The method of one of examples 12 to 15, where the first UV radiation includes an extreme ultraviolet light (EUV).

Example 17. The method of one of examples 12 to 16, where the first UV radiation and the second UV radiation includes an extreme ultraviolet light (EUV).

Example 18. A method of multiple patterning for a semiconductor device that includes: depositing a photoactive metal-based hard mask (photo-MHM) over an underlying layer, the underlying layer formed over a substrate, the photoactive hard mask including a metal; forming a mandrel over the photo-MHM, the mandrel having a pitch size of 40 nm or less; depositing a spacer material over the substrate; performing an etch back to remove lateral portions of the spacer material to expose top surfaces of the mandrel and a first portion of the photo-MHM; performing a first lithography process to pattern the photo-MHM, a first exposed region of the photo-MHM forming a first metal-oxide-network; performing a mandrel pull etch to remove the mandrel; performing a second lithography process to further pattern the photo-MHM, a second exposed region of the photo-MHM forming a second metal-oxide network; and developing the photo-MHM to remove a remainder of the photo-MHM, leaving the first metal-oxide network and the second metal-oxide network over the underlying layer.

Example 19. The method of example 18, further including, after developing the photo-MHM, etching the underlying layer using the photo-MHM as an etch mask.

Example 20. The method of one of examples 18 or 19, where the first lithography process or the second lithography process is performed by 193 nm ultraviolet (UV) light immersion lithography.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of processing a substrate, the method comprising:
    depositing a photoactive metal-based hard mask (photo-MHM) over an underlying layer, the underlying layer formed over a substrate, the photo-MHM comprising a metal;
    depositing a dielectric over the photo-MHM;
    etching a portion of the dielectric to form a first feature;
    depositing a spacer material over the first feature;
    etching the spacer material to expose top surfaces of the dielectric and a first portion of the photo-MHM;
    exposing the photo-MHM to a first ultraviolet light (UV) radiation through a first photomask, a first unmasked region of the photo-MHM being photoreacted due to the exposure to the first UV radiation;
    after the exposure, developing the photo-MHM to form a second feature in the photo-MHM; and
    etching the underlying layer using the photo-MHM as an etch mask.

2. The method of claim 1, further comprising, after etching the spacer material, etching the dielectric to expose a second portion of the photo-MHM.

3. The method of claim 2, wherein etching the dielectric is performed after exposing the photo-MHM to the first UV radiation.

4. The method of claim 3, further comprising, after etching the dielectric and before developing the photo-MHM, exposing the photo-MHM to a second UV radiation through a second photomask, a second unmasked region of the photo-MHM being photoreacted due to the exposure to the second UV radiation.

5. The method of claim 4, wherein the photo-MHM is a negative tone photoresist and wherein developing the photo-MHM removes the photo-MHM except the first unmasked region and the second unmasked region.

6. The method of claim 4, wherein the photo-MHM is a positive tone photoresist and wherein developing the photo-MHM removes only the first unmasked region and the second unmasked region of the photo-MHM.

7. The method of claim 1, further comprising, before developing the photo-MHM, performing a post-exposure bake by thermally treating the substrate.

8. The method of claim 1, wherein depositing the photo-MHM is performed by a spin-on process.

9. The method of claim 1, wherein depositing the photo-MHM is performed by a vapor deposition process.

10. The method of claim 1, wherein developing the photo-MHM is performed by a dry etch process.

11. The method of claim 1, wherein the first feature comprises recesses having a width of 20 nm or less.

12. A method of processing a substrate, the method comprising:
    depositing a photoactive metal-based hard mask (photo-MHM) over an underlying layer, the underlying layer formed over a substrate, the photoactive metal-based hard mask comprising a metal;
    depositing a protective layer over the photo-MHM;
    depositing a dielectric over the protective layer;
    etching a portion of the dielectric to form a first feature;
    depositing a spacer material over the first feature;
    etching the spacer material to expose top surfaces of the dielectric and a first portion of the protective layer;
    etching the first portion of the protective layer to expose a first portion of the photo-MHM;
    exposing the photo-MHM to a first ultraviolet light (UV) radiation through a first photomask, a first unmasked region of the photo-MHM being photoreacted due to the exposure to the first UV radiation, the protective layer blocking the first UV radiation;
    after the exposure, developing the photo-MHM to form a second feature in the photo-MHM; and
    etching the underlying layer using the photo-MHM as an etch mask.

13. The method of claim 12, further comprising:
    after etching the spacer material, etching the dielectric to expose a second portion of the protective layer; and
    etching the second portion of the protective layer to expose a second portion of the photo-MHM.

14. The method of claim 13, wherein etching the dielectric is performed after exposing the photo-MHM to the first UV radiation.

15. The method of claim 14, further comprising, after etching the dielectric, exposing the photo-MHM to a second UV radiation through a second photomask, a second unmasked region of the photo-MHM being photoreacted due to the exposure to the second UV radiation, the protective layer blocking the second UV radiation.

16. The method of claim 15, wherein the first UV radiation and the second UV radiation comprises an extreme ultraviolet light (EUV).

17. The method of claim 12, wherein the first UV radiation comprises an extreme ultraviolet light (EUV).

18. A method of multiple patterning for a semiconductor device, the method comprising:
    depositing a photoactive metal-based hard mask (photo-MHM) over an underlying layer, the underlying layer formed over a substrate, the photoactive metal-based hard mask comprising a metal;
    forming a mandrel over the photo-MHM, the mandrel having a pitch size of 40 nm or less;
    depositing a spacer material over the substrate;
    performing an etch back to remove lateral portions of the spacer material to expose top surfaces of the mandrel and a first portion of the photo-MHM;
    performing a first lithography process to pattern the photo-MHM, a first exposed region of the photo-MHM forming a first metal-oxide network;
    performing a mandrel pull etch to remove the mandrel;
    performing a second lithography process to further pattern the photo-MHM, a second exposed region of the photo-MHM forming a second metal-oxide network; and
    developing the photo-MHM to remove a remainder of the photo-MHM, leaving the first metal-oxide network and the second metal-oxide network over the underlying layer.

19. The method of claim 18, further comprising, after developing the photo-MHM, etching the underlying layer using the photo-MHM as an etch mask.

20. The method of claim 18, wherein the first lithography process or the second lithography process is performed by 193 nm ultraviolet (UV) light immersion lithography.

* * * * *